(12) United States Patent
Franz

(10) Patent No.: US 10,334,762 B2
(45) Date of Patent: Jun. 25, 2019

(54) MOVABLE RACK

(71) Applicant: Hewlett Packard Enterprise Development LP, Houston, TX (US)

(72) Inventor: John Franz, Houston, TX (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 6 days.

(21) Appl. No.: 15/545,745

(22) PCT Filed: Jan. 29, 2015

(86) PCT No.: PCT/US2015/013556
§ 371 (c)(1),
(2) Date: Jul. 24, 2017

(87) PCT Pub. No.: WO2016/122538
PCT Pub. Date: Aug. 4, 2016

(65) Prior Publication Data
US 2018/0020577 A1    Jan. 18, 2018

(51) Int. Cl.
*H05K 7/20*     (2006.01)
*H05K 7/14*     (2006.01)
*F16L 3/16*     (2006.01)

(52) U.S. Cl.
CPC ....... *H05K 7/20781* (2013.01); *H05K 7/1492* (2013.01); *H05K 7/1497* (2013.01); *H05K 7/2079* (2013.01); *F16L 3/16* (2013.01)

(58) Field of Classification Search
CPC .......... H05K 7/20781; H05K 7/1492
See application file for complete search history.

(56) References Cited

U.S. PATENT DOCUMENTS

| | | | | |
|---|---|---|---|---|
| 3,829,189 A | * | 8/1974 | Staller | A47B 53/02 104/295 |
| 4,017,131 A | | 4/1977 | Carmenisch | |
| 4,307,922 A | * | 12/1981 | Rhodes, Jr. | A47B 53/02 104/288 |
| 4,913,357 A | * | 4/1990 | Bolyard | B60S 3/04 134/123 |
| 5,160,190 A | * | 11/1992 | Farrell | A47B 53/02 312/201 |
| 5,408,089 A | * | 4/1995 | Bruno | G01V 8/20 250/221 |

(Continued)

FOREIGN PATENT DOCUMENTS

JP    2002274621    9/2002

OTHER PUBLICATIONS

"Media Racks & Mobile Aisle Systems" Retrieved from Internet Dec. 8, 2014, <http://www.datalinksales.com/media_storage_transport/media_racks/mobile_aisle_system>.

*Primary Examiner* — James Wu
*Assistant Examiner* — Michael A Matey
(74) *Attorney, Agent, or Firm* — Hewlett Packard Enterprise Patent Department

(57) ABSTRACT

The present disclosure relates to a movable rack. For example, the movable rack includes an umbilical connection to deliver a fluid, an electrical current, or a network connection to the movable rack. The present disclosure further relates to the movable rack to include a translating frame to move the umbilical connection to correspond with a movement of the movable rack.

17 Claims, 6 Drawing Sheets

(56) References Cited

U.S. PATENT DOCUMENTS

| | | | | |
|---|---|---|---|---|
| 5,697,508 A * | 12/1997 | Rifkin | A47G 25/0692 | 206/286 |
| 6,112,917 A * | 9/2000 | Baker | A47B 53/02 | 211/162 |
| 6,845,721 B1 * | 1/2005 | Doucet | A47B 53/02 | 104/173.1 |
| 7,769,486 B2 * | 8/2010 | McHenry | G06Q 10/06 | 700/214 |
| 8,777,819 B1 * | 7/2014 | Quintana | A63B 69/201 | 482/83 |
| 9,929,554 B2 * | 3/2018 | Ross | H02G 5/08 | |
| 2002/0002989 A1 * | 1/2002 | Jones | B60S 3/04 | 134/99.2 |
| 2004/0029617 A1 * | 2/2004 | Flynn | H05K 7/186 | 455/561 |
| 2007/0025271 A1 | 2/2007 | Niedrich et al. | | |
| 2008/0047593 A1 * | 2/2008 | Belanger | B60S 3/04 | 134/123 |
| 2008/0060372 A1 | 3/2008 | Hillis et al. | | |
| 2008/0280703 A1 * | 11/2008 | Eldridge | A63B 69/004 | 473/445 |
| 2009/0050591 A1 | 2/2009 | Hart | | |
| 2009/0302105 A1 * | 12/2009 | Cassady | D06F 95/00 | 235/381 |
| 2012/0075806 A1 | 3/2012 | Wormsbecher | | |
| 2012/0119632 A1 * | 5/2012 | Bousseton | H05K 7/20745 | 312/236 |
| 2012/0127653 A1 | 5/2012 | Keisling | | |
| 2012/0155027 A1 | 6/2012 | Broome et al. | | |
| 2012/0300398 A1 * | 11/2012 | Eckberg | H05K 7/2079 | 361/692 |
| 2013/0320779 A1 | 12/2013 | Yang | | |
| 2014/0058554 A1 * | 2/2014 | Janet | B65G 49/00 | 700/214 |
| 2014/0319985 A1 * | 10/2014 | Kikuchi | H05K 7/1497 | 312/317.1 |
| 2015/0105930 A1 * | 4/2015 | Sparrowhawk | G01R 11/04 | 700/297 |
| 2017/0251567 A1 * | 8/2017 | Naor | H05K 7/20745 | |
| 2018/0014485 A1 * | 1/2018 | Whitcher | A01G 2/20 | |

* cited by examiner

200

500

600

MOVABLE RACK

BACKGROUND

Server racks are designed to hold a variety of technologies including processors, storage, power supplies, networking equipment, input/output ports, and other related technologies. Some of these technologies generate heat that can cause overheating if not properly cooled. Server racks can be designed in a number of ways that increases the possible density of the rack. The rack may also be configured to allow servicing of components by a user or technician.

BRIEF DESCRIPTION OF THE DRAWINGS

Certain examples are described in the following detailed description and in reference to the drawings, in which.

DETAILED DESCRIPTION OF SPECIFIC EXAMPLES

A rack, database rack, or server rack may each have multiple functions that go beyond a simple structure for holding components. A rack may be designed not only to hold servers, but also storage technology, additional processors, or any other similar technology. Each electronic component stored in the rack can be a separate server, blade, cartridge, networking card, input/output port, power supply, or any other number of electronics. The design of these racks can vary based on their purpose and usage. However, most racks use at least some form of cooling. The cooling can take a variety of forms including cooling via air or a liquid.

Data center designs and layouts may support air cooled racks using vented tiles and cold or hot aisle containment. As most data centers are rarely accessed by workers for maintenance or other reason, these cold and hot aisles can comprise ~50% of the floor space resulting in very inefficient use of real estate.

In the present disclosure, liquid cooled servers, or other non-aisle cooled servers are closed loop and do not make use of vented tiles and similarly do not use hot aisle containment space. Accordingly, the aisle spaces for cooling represent large unnecessary amounts of space that may be used for additional data components or racks. Further, access for installation, maintenance, and other issues may be improved with the ability to create space between rows of racks. The use of movable racks and movable liquid cooled racks are discussed in the present application as a way to take advantage of previously unused space while still allowing movement for access by a technician. These movable racks may be supported by umbilical connections which deliver power, fluid for cooling, network connectivity, and other utilities to the racks for use by the components housed therein. To alleviate strain on the umbilical connections and to allow greater efficiency and range of motion, the umbilical connections, may be connected to a translating frame which moves to correspond to movement of the movable rack or racks the translating frame is serving.

Figure 1:
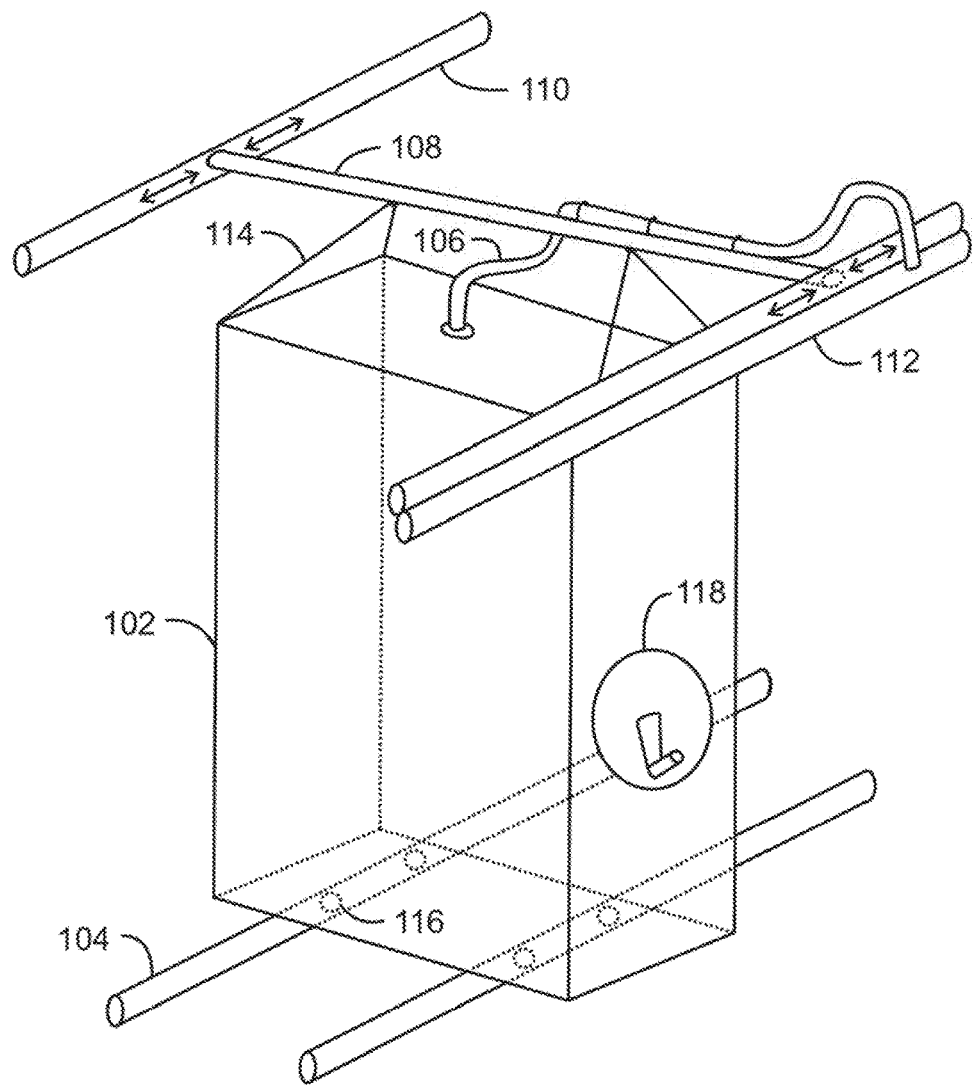
FIG. 1 is a diagram of a movable rack system, according to an example.

FIG. 1 is a diagram of a movable rack system 100, according to an example. The movable rack 102 may be placed on movable rack rail 104. In an example, the moveable rack 102 may contain data components that give off heat such as processors, data storage components, networking cards, or other electronic components. In an example, the movable rack 102 may be a movable liquid cooled rack in which electronic components can be cooled by a liquid that is cycled within the rack or is pumped in and out from an umbilical connection 106. The movable rack may also be cooled by air or any other fluid coolant pumped through the umbilical connection 106. The connection location of the umbilical connection 106 may be from above, below, or any available side. As noted herein, the umbilical connection may provide fluid for cooling the components of the movable rack 102. Further, the umbilical connection 106 may provide electrical current to power the components in the rack or any other component of the rack that uses electrical power to function. The umbilical connection 106 may also provide network connectivity to the movable rack 102 and its components. The umbilical connection 106 may supply any number of other inputs and outputs to and from the movable rack 102. The umbilical connection 106, may be a single connection for each input and output or may have a number of connections providing each input and output, or any number of other combinations. The umbilical connection 106 may include flexible hosing, wiring, or other connections that supply the movable rack 102 with its inputs and outputs such as fluid for cooling, electrical current, and network connectivity.

The umbilical connection 106 may be supported by a translating frame 108 which moves with the movement of the movable rack 102 moving along the movable rack rail 104. The translating frame 108 may be guided by a frame track 110. In an example the frame track is connected to the ceiling or wall and is parallel to the movable rack rail 104 and accordingly allows the translating frame to move the umbilical connection 106 as the movable rack 102 moves. The frame track 110 may also include an umbilical supply 112 which may provide a fluid, an electrical current, or a network connection, among others, to each umbilical connection 106 regardless of the position of the umbilical connection 106 and translating frame along the frame track 110.

The movable rack rail 104 may guide the linear movement of the movable rack 102. In an example, the movable rack 102 may move beyond the range of motion of the umbilical connection 106, in which case the translating frame 108 would move to allow a greater range of motion by the movable rack 102 while still maintaining the umbilical connection 106. A translating frame connector 114 may be used to connect the translating frame directly to the movable rack 102. Accordingly, when the movable rack 102 moves, the translating frame connector 114 may bear the force of this movement rather than the umbilical connection 106, which may be fragile.

In an example, the movable rack 102 may move along the movable rack rail 104 on wheels 116. However it should be noted that any moving assembly that can support a stationary movable rack 102 and also allow movement may be used. To aid in moving the movable rack 102, a mover tool 118 may be used. The mover tool 118 may be a simple handle, crank assembly or any other mechanism that aids the movement of the movable rack 102, for example, by engaging the wheels 116. In an example, the mover tool 118 may move more than a single movable rack 102 along the movable rack rail 104, but may also move an entire row of movable racks 102.

Figure 2:
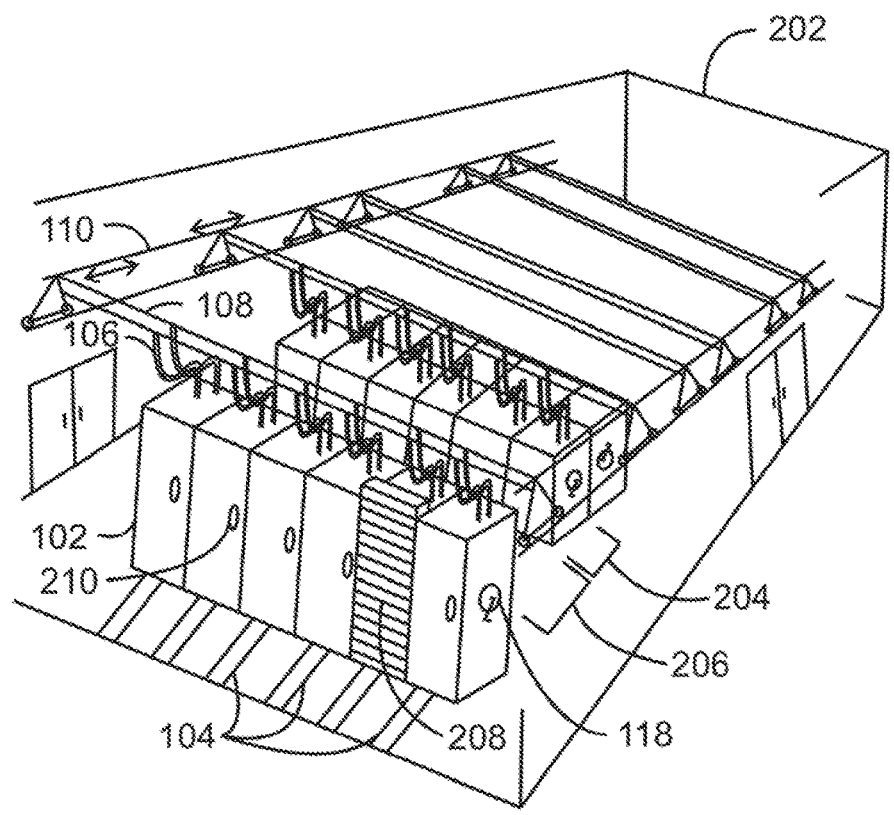
FIG. 2 is a diagram of a plurality of movable rack systems in a data center, according to an example.

FIG. 2 is a diagram of a number of movable rack systems 200 in a data center, according to an example. Like numbered items are as described with respect to FIG. 1. The plurality of movable rack systems 200 are shown in a data center 202. The data center 202 is shown here for exemplary reasons only and does not limit the location of the movable racks 102. The data center 202 may not be a purpose built room, but may be any space capable of holding and supporting a movable rack 102. Further, the data center 202 may have limited space and movable racks 102 may be used to increase density of data components in that limited space.

A movable rack 102 may belong to a row of movable racks 204. This, row of movable racks 204 may be moved manually, automatically, and may also be aided by a mover tool 118. In an example, such as when each movable rack 102 is a liquid cooled rack, the row of movable racks 204 may be directly adjacent to a second row of movable racks 204 as no heating or cooling row is used to allow airflow between each movable rack or row of movable racks. Rather than cooling through airflow from aisles, the cooling may be either entirely contained within each movable rack 102, or due to the cooling fluid provided by the umbilical connection 106. An access space 206 may also be provided between rows of movable racks 204. For example, the access space 206 may provide sufficient space for a technician or other user to access a movable rack 102 within of movable racks 204.

The space to make an access space practical may vary based on the exterior of each movable rack 102 which may have panels that open to allow access to the internal components of the movable rack 102. In an example a tambour door 208 may be used to minimize the access space 206 for accessing a movable rack 102. In other examples a swinging door exterior 210 may be used, however the exterior of the movable rack 102 may make use of any suitable technology to allow access to the internal components of a movable rack 102.

As seen in FIG. 2, there may be several umbilical connections 106 to each movable rack 102 or in some cases there may be no umbilical connection 106 present depending on the other means the movable rack 102 may be obtaining its power, network connectivity, or cooling resources, for example, an entire moving row may be fed from a single set of umbilical connections 106. Further, in FIG. 2 a single translating frame 108 is shown supporting the umbilical connections 106 for each row of movable racks 204. The sharing of a translating frame 108 by the umbilical connections 106 allows greater efficiency in the number of translating frames as well as greater organization for the number of umbilical connections 106 to each row of movable racks 204.

Figure 3:
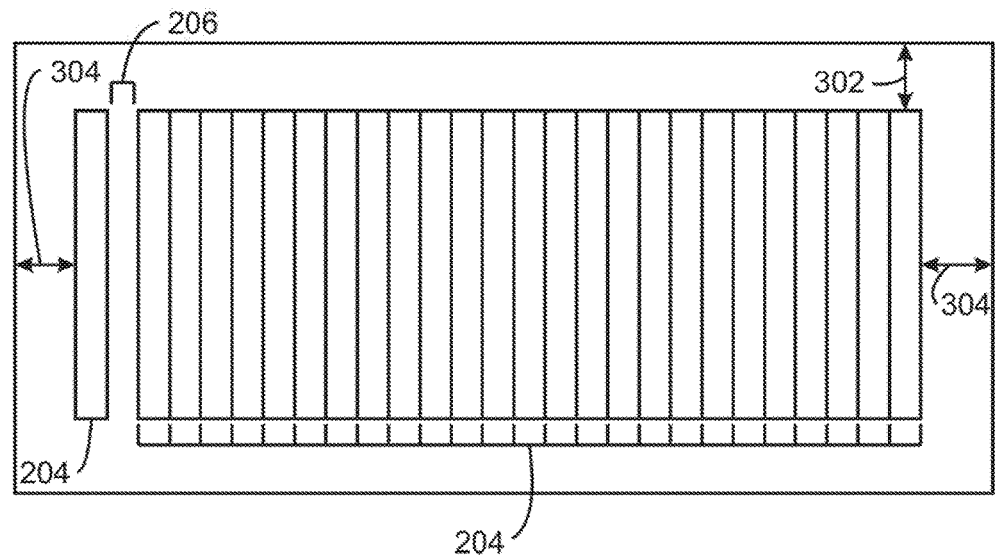
FIG. 3 is a top view of several rows of movable rack systems, according to an example.

FIG. 3 is a top view of several rows of movable rack systems 300, according to an example. The vertical space 302 and the horizontal space 304 are included to show possible spacing from the walls of a data center 202. The movement space may be the space a movable rack may move within a data center 202. In an example, the movable rack rail 104 may only be large enough for the number of movable racks 102 in the data center 202 plus a number of aisles of access space 206 less than the number of rows of movable racks 204 in the data center.

The top view shown in FIG. 3 includes a top view of an aisle of access space 206 and many rows of movable racks 204. In an example, each row of movable racks 204 may be placed contacting each other or directly adjacent to each other. This may lead to a substantial increase in the capacity of data centers compared to data centers where cooling space is present between each row of movable racks 204. At least one aisles worth of access space 206 may be included to allow for access to rows of movable racks 204. Further, each row of moveable racks 204 may be moved into the location of the aisle of access space 206 in order to create a new aisle of access space 206 behind it. In this manner additional rows of racks 206 may be accessed while still preserving the increased density allowed by directly adjacent rows of movable racks 204.

Figure 4:
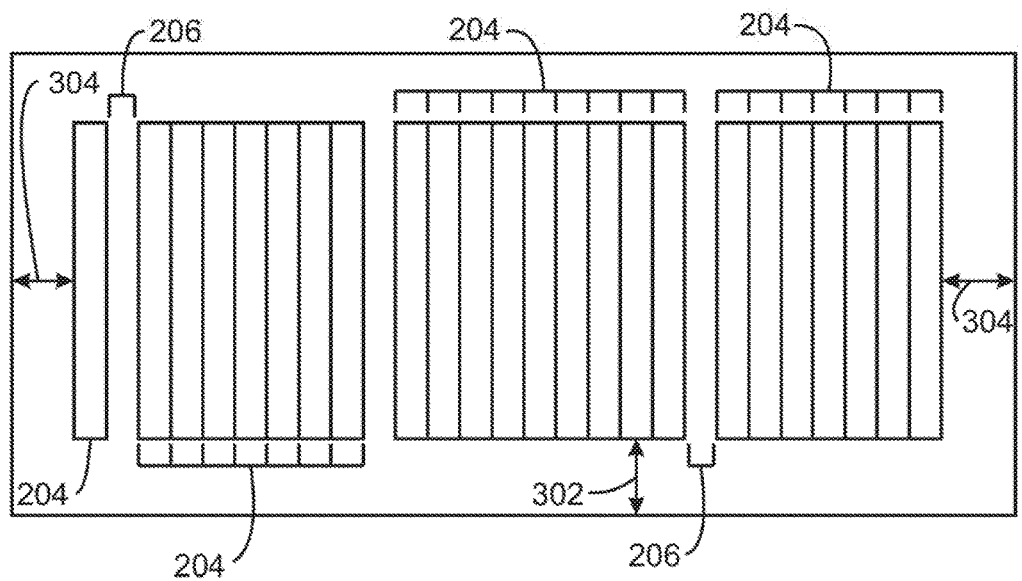
FIG. 4 is a top view of several rows of movable rack systems with multiple access spaces, according to an example.

FIG. 4 is a top view 400 of several rows of movable rack systems with multiple access spaces, according to an example. Like numbered items are as described with respect to FIGS. 2 and 3. In this top view, multiple aisles of access space 206 are included. In an example, including the example shown in FIG. 3, having only one aisle access space may be unwieldy. In an example, having only one access space aisle and a large number of rows of movable racks 204 may make a user or technician move every single roof movable racks 204 simply to access movable rack 102 far away from the current, aisle of access space 206. Accordingly, an example include a plurality of aisles of access space 206 that may be present in a data center in varying intervals throughout the adjacent rows of movable racks 204.

In an example however, nearly every row of movable rack 204 may be in contact with another movable rack 204. Accordingly, aisles for access space 206 may be combined on one side of the data center 202, when not in use. This configuration may displace some of the rows of movable racks 204 by the total distance of each aisle of access space 206 combined. This distance may be greater than a flexible umbilical connection 106 by itself may reach. Accordingly, the translating frame 108 may assist in moving the umbilical connection 106 without strain to accommodate the increased distance traveled by the row of movable racks 204.

Figure 5:
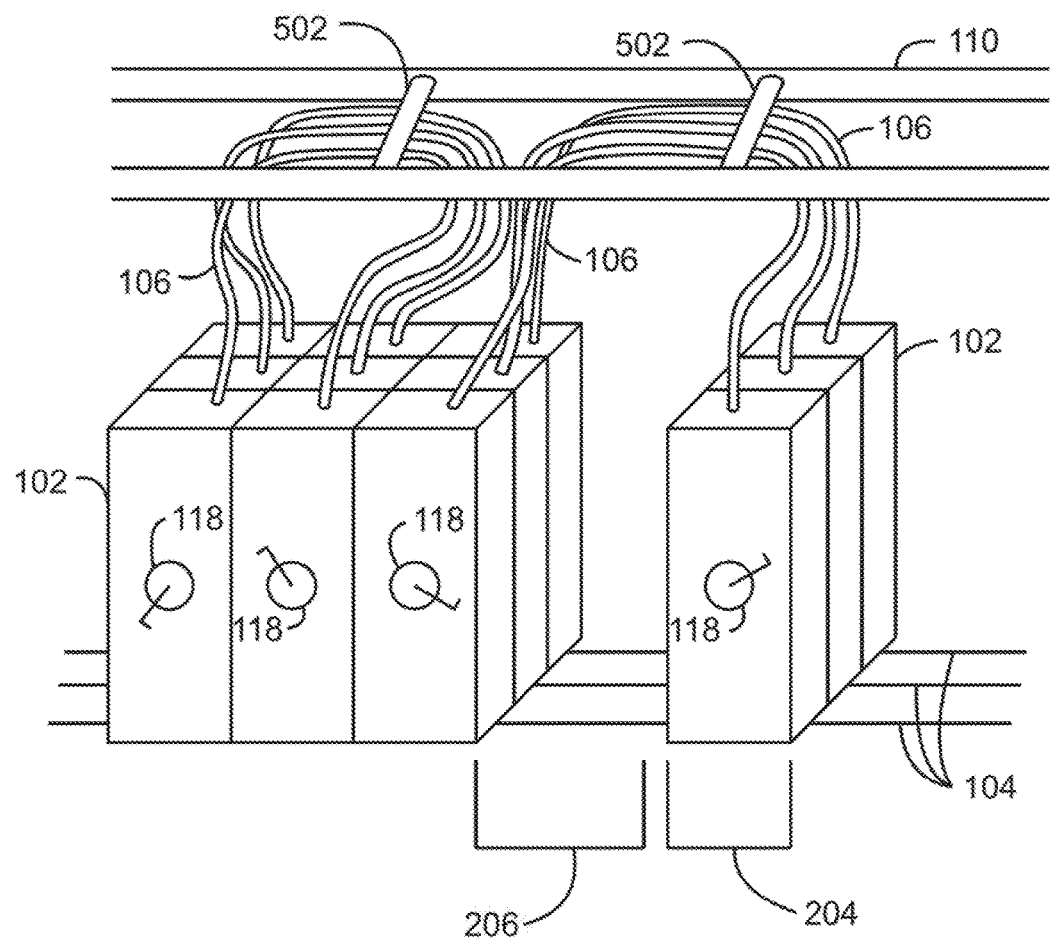
FIG. 5 is a diagram of movable rack system with dual serving umbilical connections, according to an example.

FIG. 5 is a diagram of movable rack system with dual serving umbilical connections, according to an example. Like numbered items are as described with respect to FIG. 1 and FIG. 2. This additional perspective, shows in part, several different rows of removable racks 204 being supplied by dual-serving umbilical connections. The use of a dual serving translating frame 502 may reduce the number of translating frames 108 that are present to support umbilical connections for a data center 202.

Figure 6:
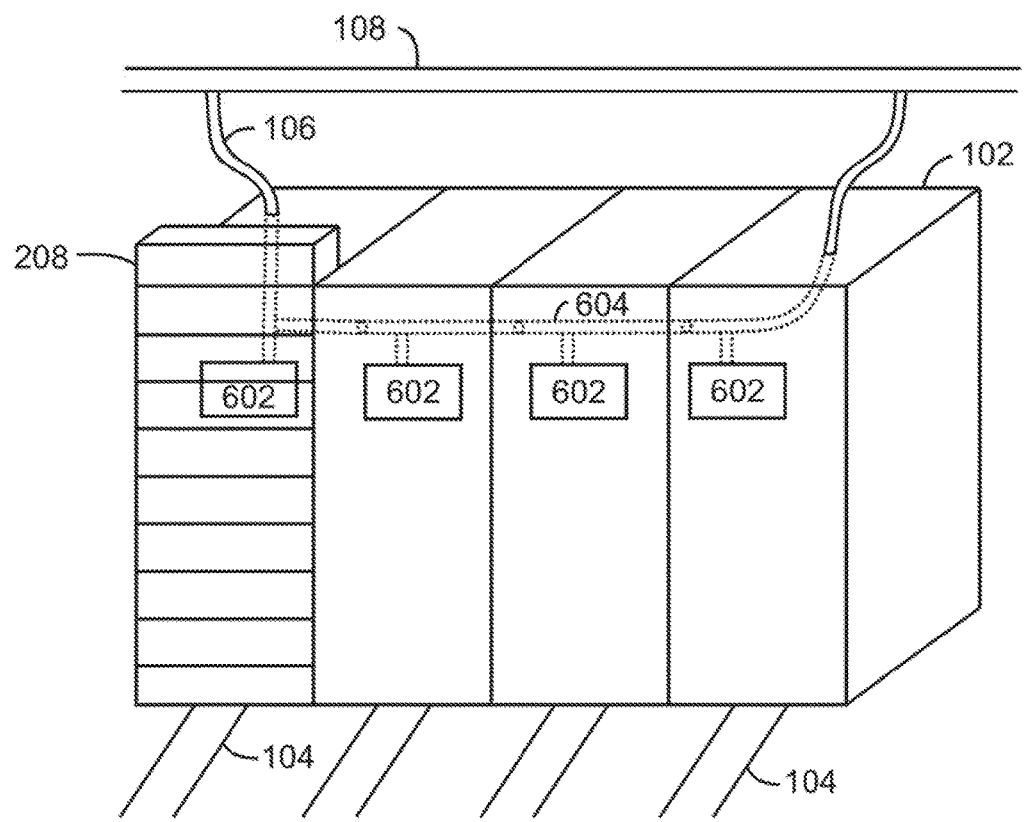
FIG. 6 is a diagram of a movable rack system with pass through umbilical connections, according to an example.

FIG. 6 is a diagram of a movable rack system with pass through umbilical connections 600, according to an example. Like numbered items are as described with respect to FIG. 1 and FIG. 2. Each movable rack 102 may include data components 602 that generate heat and may use cooling. Each movable rack 102 may be connected to another movable rack 102 in the row of movable racks 204. A resource sharing system 604 may allow the sharing of resources provided by an umbilical connection 106 between each movable rack 102. The resource sharing system 604 could include fluid for cooling heated components, electrical current, networking connectivity, or any other similar resource used by a movable rack 102. In an example, the interconnectivity between each movable rack 102 in a row of movable racks 204 may reduce the number of umbilical connections 206 that a row of movable racks 204 may be connected to.

Additionally, although FIG. 6 shows a resource sharing system 604 internal to the row of movable racks 204, it may be external to the row of movable racks 204, for example, resting on the movable racks 204, or in any other suitable configuration. Similarly, the translating frame 208, the umbilical connection 106 and the frame track, although pictured here above the movable rack 102, may also be positioned to coincide or even be below the movable rack rail 104, or may also be in any other suitable position.

While the present techniques may be susceptible to various modifications and alternative forms, the exemplary examples discussed above have been shown only by way of example. It is to be understood that the technique is not intended to be limited to the particular examples disclosed herein. Indeed, the present techniques include all alternatives, modifications, and equivalents falling within the true spirit and scope of the appended claims.

EXAMPLES

Example 1

In an example, an apparatus for a movable rack may include an umbilical connection to deliver a fluid, an electrical current, a network connection, or any combinations thereof, to the movable rack. In an example, the apparatus for the movable rack also may include a translating frame to move the umbilical connection to correspond with a movement of the movable rack. In an example, a frame track mounted parallel to the moveable rack's direction of movement may also be included. In an example, the apparatus may also include an umbilical supply mounted on the frame track to supply the umbilical connection with the fluid, the electrical current, the network connection, or any of the combinations thereof, regardless of a position of the umbilical connection along the frame track. In some examples, the translating frame may be movably mounted on the frame track to aid the movement of the umbilical connection corresponding to the movement of the movable rack. In some examples, the apparatus includes a translating frame connector to connect the translating frame to the movable rack, bear a force generated by moving the movable rack, and move in response to the force generated by moving the movable rack. In some examples, the umbilical connection may be flexibly connected to the movable rack and the translating frame and the umbilical connection are located outside and above the movable rack. In an example of the apparatus the umbilical connection and translating frame correspond to a row of movable racks. Further, at least one translating frame may support a plurality of umbilical connections corresponding to a plurality of rows of racks. The translating frame and the umbilical connection apparatus may further be incorporated into a movable rack rail, the movable rack rail to guide a movement of the movable rack.

Example 2

In an example, a movable rack system includes a movable rack, a movable rack rail to guide a movement of the movable rack and act as a floor for the movable rack to rest on when stationary, an umbilical connection to deliver a fluid, an electrical current, or network connection, or any combinations thereof, to the movable rack, and a translating frame to move the umbilical connection to correspond with the movement of the movable rack. In an example, the system may include a first position with an access space that may be adjacent to a first end of the movable rack and a second position wherein the movable rack may be located in a former location of the access space. The system of claim may include the movable rack as liquid cooled from liquid delivered by the umbilical connection. The system may include a movement space for the movable rack rail to be sized by adding a size of a number of movable racks in a data center to a desired access space for accessing a predetermined number of movable racks at the same time. In an example, the movable rack of the system may include a mover tool to move the movable rack along the movable rack rail and a tambour door of the movable rack to open and close for access to the inside of the movable rack.

Example 3

In an example, a movable rack system includes a first movable rack, a second movable rack, a movable rack rail, wherein the movable rack rail may be to guide a movement of both the first and second movable racks. The movable rack system may also include an umbilical connection to deliver a fluid, an electrical current, a network connection, or any combinations thereof to the first movable rack. In an example, the movable rack system may also include a translating frame to move the umbilical connection to correspond with a movement of the first movable rack. In an example, the movable rack system includes a first position with an access space between the first movable rack and the second movable rack, and a second position wherein the first movable rack may be located in a former location of the access space. In an example, the movable rack system may be such that a second umbilical connection delivers a fluid, an electrical current, a network connection, or any combinations thereof, to the second movable rack. In an example of the movable rack system, the translating frame moves the second umbilical connection to correspond with both the movement of the first movable rack and the movement of the second movable rack.

What is claimed is:

1. An apparatus for a movable rack comprising:
   an umbilical connection to deliver a fluid, an electrical current, a network connection, or any combinations thereof, to the movable rack;
   a translating frame to move the umbilical connection to correspond with a movement of the movable rack;
   a frame track connected to the translating frame and mounted parallel to the moveable rack's direction of movement, to move the translating frame parallel with the movement of the movable rack; and
   a translating frame connector to connect the translating frame directly to the movable rack, the translating frame connector not directly connected to the umbilical connection or to the frame track.

2. The apparatus of claim 1, further comprising:
   an umbilical supply mounted on the frame track to supply the umbilical connection with the fluid, the electrical current, the network connection, or any of the combinations thereof, regardless of a position of the umbilical connection along the frame track; and
   wherein the translating frame is movably mounted on the frame track to aid the movement of the umbilical connection corresponding to the movement of the movable rack.

3. The apparatus of claim 1, wherein the translating frame connector is to:
   bear a force generated by moving the movable rack; and
   move in response to the force generated by moving the movable rack.

4. The apparatus of claim 1, wherein:
the umbilical connection is flexibly connected to the movable rack; and
the translating frame and the umbilical connection are located outside and above the movable rack.

5. The apparatus of claim 1, wherein the umbilical connection and translating frame correspond to a row of movable racks.

6. The apparatus of claim 1, wherein at least one translating frame supports a plurality of umbilical connections corresponding to a plurality of rows of racks.

7. The apparatus of claim 1, wherein the translating frame and the umbilical connection are incorporated into a movable rack rail, the movable rack rail to guide a movement of the movable rack.

8. The apparatus of claim 1, wherein the frame track is a first frame track, the apparatus further comprising:
a second frame track across from and parallel to the first frame track, the movable rack disposed below and between the first and second frame tracks; and
wherein the translating frame is mounted cross-wise between the first and second frame tracks, above the movable rack.

9. The apparatus of claim 1, further comprising:
an umbilical supply mounted on the frame track to supply the umbilical connection with the fluid, the electrical current, the network connection, or any of the combinations thereof, regardless of a position of the umbilical connection along the frame track; and
wherein umbilical supply is mounted along a length of the umbilical supply and parallel to the frame track along a length of the frame track.

10. A movable rack system comprising:
a movable rack;
a movable rack rail to:
guide a movement of the movable rack; and
act as a floor for the movable rack to rest on when stationary;
an umbilical connection to deliver a fluid, an electrical current, or network connection, or any combinations thereof, to the movable rack;
a translating frame to move the umbilical connection to correspond with the movement of the movable rack;
a frame track mounted parallel to the moveable rack's direction of movement;
an umbilical supply mounted on the frame track to supply the umbilical connection with the fluid, the electrical current, the network connection, or any of the combinations thereof, regardless of a position of the umbilical connection along the frame track; and
wherein the translating frame is movably mounted on the frame track to aid the movement of the umbilical connection corresponding to the movement of the movable rack.

11. The system of claim 10, comprising:
a first position with an access space that is adjacent to a first end of the movable rack; and
a second position wherein the movable rack is located in a former location of the access space.

12. The system of claim 10, wherein the movable rack is liquid cooled from liquid delivered by the umbilical connection.

13. The system of claim 11, wherein a movement space for the movable rack rail is sized by adding a size of a number of movable racks in a data center to a desired access space for accessing a predetermined number of movable racks at the same time.

14. The system of claim 10, wherein the movable rack comprises:
a mover tool to move the movable rack along the movable rack rail; and
a tambour door of the movable rack to open and close for access to the inside of the movable rack.

15. A movable rack system comprising:
a first movable rack;
a second movable rack;
a movable rack rail, wherein the movable rack rail is to guide a movement of both the first and second movable racks;
an umbilical connection to deliver a fluid, an electrical current, a network connection, or any combinations thereof to the first movable rack;
a translating frame to move the umbilical connection to correspond with a movement of the first movable rack;
a frame track mounted parallel to the first moveable rack's direction of movement;
an umbilical supply mounted on the frame track to supply the umbilical connection with the fluid, the electrical current, the network connection, or any of the combinations thereof, regardless of a position of the umbilical connection along the frame track; and
wherein the translating frame is movably mounted on the frame track to aid the movement of the umbilical connection corresponding to the movement of the movable rack.

16. The movable rack system of claim 15, comprising:
a first position with an access space between the first movable rack and the second movable rack; and
a second position wherein the first movable rack is located in a former location of the access space.

17. The movable rack system of claim 15, wherein:
a second umbilical connection delivers a fluid, an electrical current, a network connection, or any combinations thereof, to the second movable rack; and
the translating frame moves the second umbilical connection to correspond with both the movement of the first movable rack and the movement of the second movable rack.

* * * * *